US012224111B2

(12) United States Patent
Ito et al.

(10) Patent No.: US 12,224,111 B2
(45) Date of Patent: Feb. 11, 2025

(54) COMPOSITE ELECTRONIC COMPONENT

(71) Applicant: TDK CORPORATION, Tokyo (JP)

(72) Inventors: Takashi Ito, Tokyo (JP); Tasuku Kawagoe, Tokyo (JP); Keigo Higashida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 199 days.

(21) Appl. No.: 18/124,236

(22) Filed: Mar. 21, 2023

(65) Prior Publication Data

US 2023/0317366 A1 Oct. 5, 2023

(30) Foreign Application Priority Data

Mar. 31, 2022 (JP) ................. 2022-059116

(51) Int. Cl.
| | |
|---|---|
| *H05K 1/11* | (2006.01) |
| *H01F 27/29* | (2006.01) |
| *H01F 27/40* | (2006.01) |
| *H05K 1/18* | (2006.01) |

(52) U.S. Cl.
CPC ......... *H01F 27/402* (2013.01); *H01F 27/292* (2013.01); *H05K 1/115* (2013.01); *H05K 1/181* (2013.01); *H05K 2201/10015* (2013.01); *H05K 2201/10022* (2013.01); *H05K 2201/1003* (2013.01); *H05K 2201/1006* (2013.01)

(58) Field of Classification Search
CPC ........... H01F 27/292; H01F 2017/0093; H01F 27/06; H01F 2027/065; H05K 1/115; H05K 1/181; H05K 2201/10015; H05K 2201/10022; H05K 2201/1003; H05K 2201/1006

See application file for complete search history.

(56) References Cited

U.S. PATENT DOCUMENTS

| | | | |
|---|---|---|---|
| 2020/0382152 A1* | 12/2020 | Tsukamoto | ............ H03H 7/461 |
| 2021/0134510 A1* | 5/2021 | Anderson | ........... H01F 27/2804 |
| 2021/0391841 A1* | 12/2021 | Toujo | ...................... H01L 23/12 |

FOREIGN PATENT DOCUMENTS

JP 2019-193000 A 10/2019

* cited by examiner

*Primary Examiner* — Sherman Ng
(74) *Attorney, Agent, or Firm* — Oliff PLC

(57) ABSTRACT

The composite electronic component includes: a substrate having a GND pattern; a coil component having at least three terminals and mounted on a first surface of the substrate; and an overlapping arrangement component mounted on the first surface so that at least a part of the overlapping arrangement component overlaps the coil component when viewed from a first direction perpendicular to the first surface. The substrate has at least three coil connection patterns formed on the first surface and connected to the terminals, at least two component connection patterns formed on the first surface and connected to the overlapping arrangement component, and a GND via connecting one of the component connection patterns and the GND pattern to each other. The GND via is arranged in a substrate outer region, which is outside a region of a hypothetical polygon connecting all of the coil connection patterns on the substrate with a shortest perimeter, when viewed from the first direction.

7 Claims, 8 Drawing Sheets

COMPOSITE ELECTRONIC COMPONENT

FIELD OF THE INVENTION

The present invention relates to a composite electronic component including a substrate and components mounted on the substrate.

BACKGROUND OF THE INVENTION

A coil component including an inductor and a transformer, such as a choke coil, may be used alone, but may form a composite electronic component mounted on a substrate together with other electronic components such as a capacitor. Such a composite electronic component forms a circuit having a predetermined function, such as a low pass filter for reducing noise, by a substrate and a plurality of elements or electronic components mounted thereon.

As one of such composite electronic components, a composite electronic component has been proposed in which, below a coil component having a relatively large size, another electronic component with a lower height is arranged on a substrate so as to overlap the coil component when viewed from a direction perpendicular to the mounting surface (see JP 2019-193000 A and the like).

Such an overlapping arrangement type composite electronic component is advantageous in that the area of the substrate can be reduced as compared with a non-overlapping arrangement type composite electronic component. However, in the conventional overlapping arrangement type composite electronic component, there have been cases where the noise generated in the electrical signal transmitted through the circuit cannot be sufficiently reduced.

CITATION LIST (PATENT DOCUMENT)

Patent Document 1: JP 2019-193000 A

BRIEF SUMMARY OF THE INVENTION

The present disclosure provides a composite electronic component capable of reducing noise by reducing the area of the substrate.

A composite electronic component according to a first aspect of the present disclosure includes: a substrate having a GND pattern; a coil component having at least three terminals and mounted on a first surface of the substrate; and an overlapping arrangement component that is an electronic component having a height lower than that of the coil component and that is mounted on the first surface so that at least a part of the overlapping arrangement component overlaps the coil component when viewed from a first direction perpendicular to the first surface. The substrate has at least three coil connection patterns formed on the first surface and connected to the terminals, at least two component connection patterns formed on the first surface and connected to the overlapping arrangement component, and a GND via electrically connecting one of the component connection patterns and the GND pattern to each other. The GND via is arranged in a substrate outer region, which is outside a region of a hypothetical polygon connecting all of the coil connection patterns on the substrate with a shortest perimeter, when viewed from the first direction.

Since such a composite electronic component has an overlapping arrangement component, the area of the substrate can be reduced. In addition, since the GND via is arranged in the substrate outer region, the area where the GND pattern in the substrate overlaps other patterns (including a wiring) or the like can be reduced. Therefore, in the composite electronic component according to the present disclosure, the generation of stray capacitance is reduced. As a result, noise generated in an electrical signal transmitted through a circuit formed by the composite electronic component can be effectively reduced.

In addition, for example, the coil component may be a common mode filter (common mode choke coil).

In the composite electronic component including a coil component that is a common mode filter, the performance as a noise filter can be improved by reducing noise generated in the electrical signal transmitted through the circuit formed by the composite electronic component.

In addition, for example, the overlapping arrangement component may be a capacitor.

Such a composite electronic component forms a circuit in which a coil component and a capacitor are combined, and can be suitably used as a noise filter or the like for reducing noise.

In addition, for example, the composite electronic component may further include a resistive element mounted on the first surface so that at least a part of the resistive element overlaps the coil component when viewed from the first direction. On the substrate, one end of the resistive element may be wired to one of the coil connection patterns, and the other end of the resistive element may be wired to another one of the component connection patterns.

The composite electronic component in which the resistive element is further arranged so as to overlap the coil component is advantageous from the viewpoint of substrate area reduction or high-density mounting.

In addition, for example, at least a part of the resistive element may be arranged in a substrate inner region, which is inside the region of the hypothetical polygon on the substrate, when viewed from the first direction.

By arranging the resistive element in the substrate inner region, the generation of stray capacitance between the resistive element and the wiring and the GND pattern connected to the resistive element can be prevented. As a result, noise can be effectively reduced.

In addition, for example, at least a part of another one of the component connection patterns may be arranged in a substrate inner region, which is inside the region of the hypothetical polygon on the substrate, when viewed from the first direction.

With such an arrangement, the wiring distance to the overlapping component can be shortened, and the generation of stray capacitance between the wiring from the coil connection pattern to the component connection pattern and the GND pattern can be prevented. As a result, noise can be effectively reduced.

In addition, for example, the composite electronic component may further include an ESD protection element mounted on the first surface so that at least a part of the ESD protection element overlaps the coil component when viewed from the first direction. On the substrate, the ESD protection element may be wired to one of the coil connection patterns.

The composite electronic component in which the ESD protection element is further arranged so as to overlap the coil component is advantageous from the viewpoint of substrate area reduction or high-density mounting.

DETAILED DESCRIPTION OF THE INVENTION

Hereinafter, the present invention will be described below based on embodiments shown in the diagrams.

Figure 1:
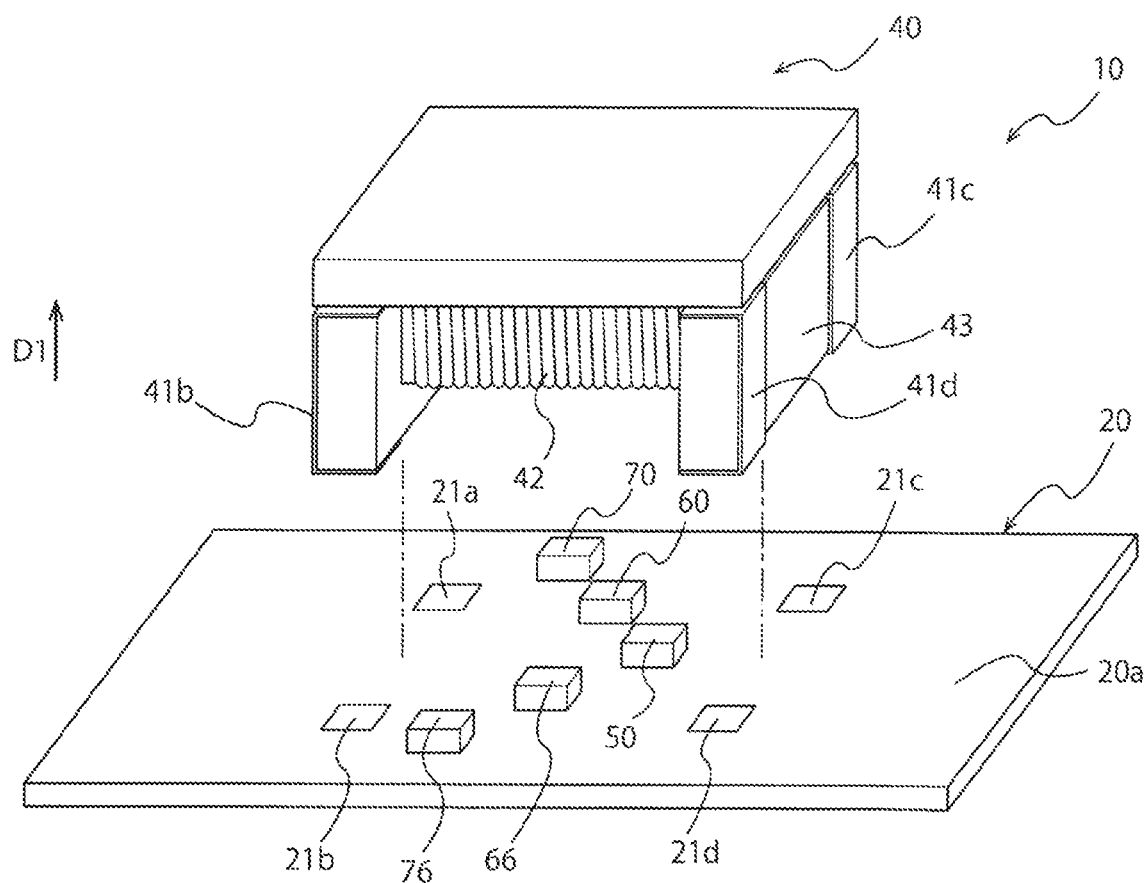
FIG. 1 is a schematic diagram of a composite electronic component according to an embodiment of the present disclosure.

FIG. 1 is a schematic diagram of a composite electronic component 10 according to an embodiment of the present disclosure. For ease of explanation, FIG. 1 shows a state in which a coil component 40 is offset with respect to a substrate 20 in a first direction D1 perpendicular to a first surface 20a, which is the mounting surface of the substrate 20. In the actual composite electronic component 10, however, the coil component 40 is connected to the first surface 20a that is the mounting surface of the substrate 20.

As shown in FIG. 1, the composite electronic component 10 has the substrate 20 and the coil component 40 mounted on the first surface 20a of the substrate 20. In addition, the composite electronic component 10 includes a capacitor 50 as an overlapping arrangement component mounted on the first surface 20a of the substrate 20 and resistive elements 60 and 66 similarly mounted on the first surface 20a of the substrate 20. Additionally, the composite electronic component 10 includes ESD protection elements 70 and 76 mounted on the first surface 20a of the substrate 20.

Figure 2:
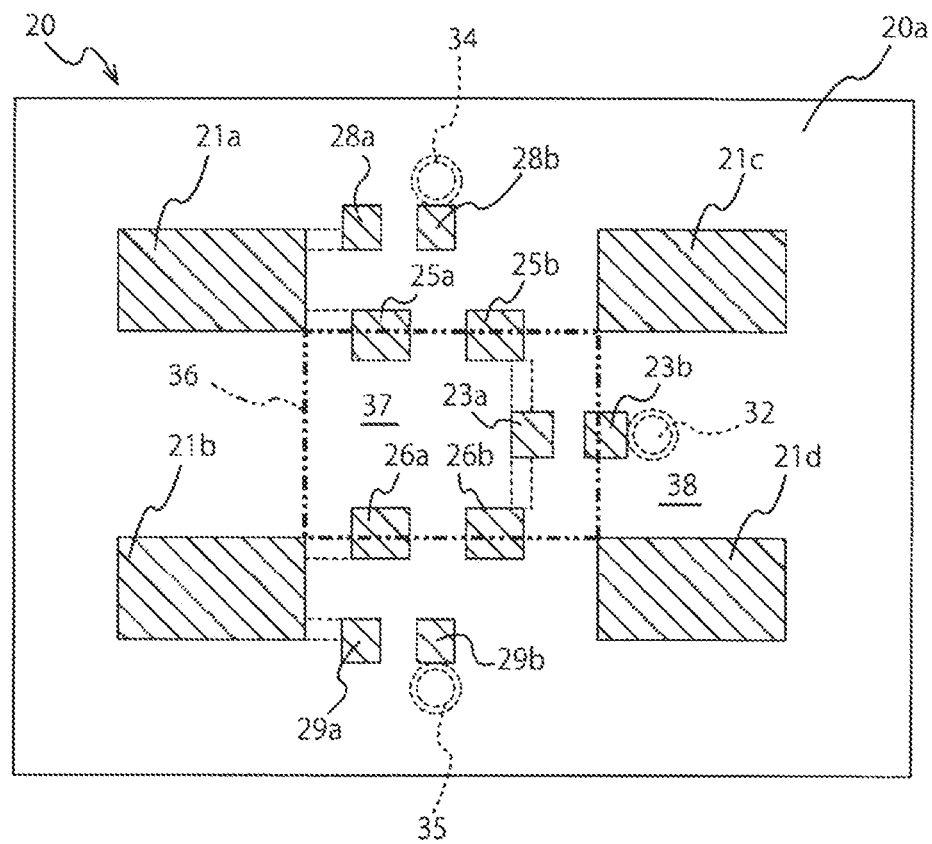
FIG. 2 is a plan view showing a substrate included in the composite electronic component shown in FIG. 1.
Figure 4:
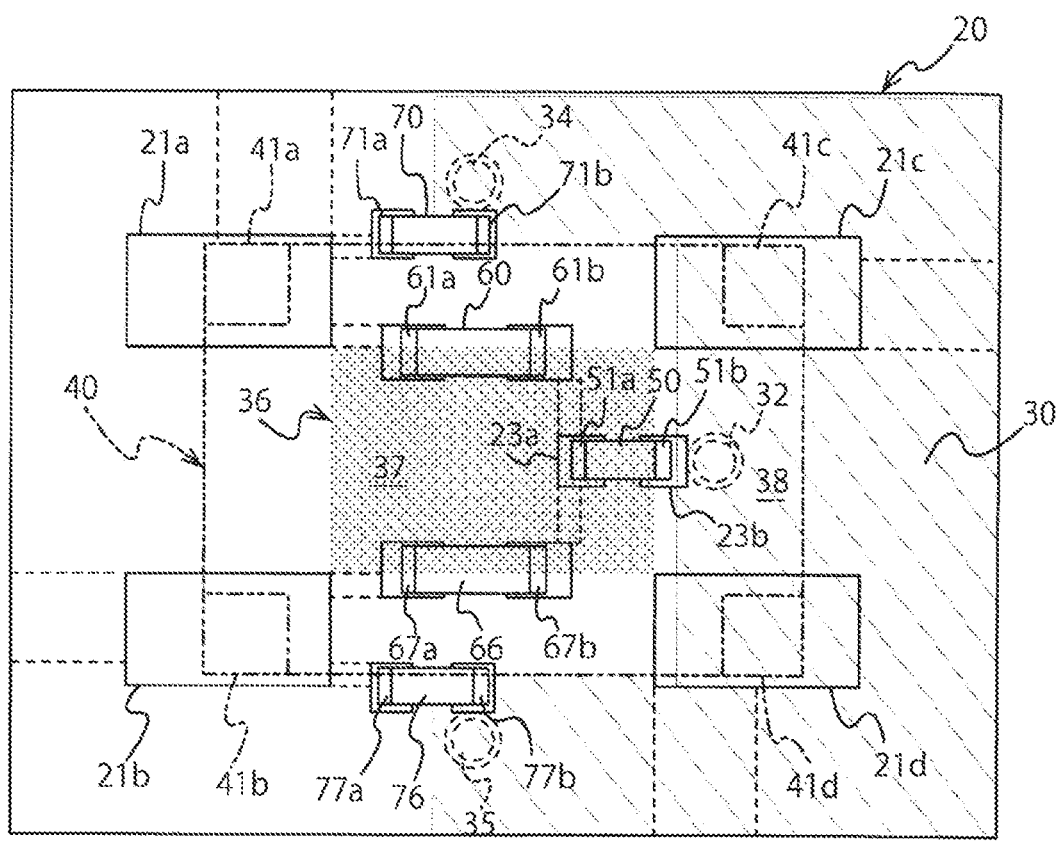
FIG. 4 is a conceptual diagram showing the arrangement of electronic components and connection patterns in the composite electronic component shown in FIG. 1.

The substrate 20 shown in FIG. 1 is a printed substrate, a lead frame, a BT substrate, or the like, and has a GND pattern 30 using a conductor wiring inside or on the back side (negative Z-axis direction side) (see FIG. 4). In addition, as shown in FIG. 2, a plurality of patterns (first to fourth coil connection patterns 21a to 21d, first and second component connection patterns 23a and 23b, first and second resistor connection patterns 25a, 25b, 26a, and 26b, and first and second ESD connection patterns 28a, 28b, 29a, and 29b) are formed on the first surface 20a that is one surface of the flat substrate 20. These patterns (connection patterns) are formed by conductor wirings exposed on the first surface 20a. The GND pattern 30 shown in FIG. 4 is not exposed on the first surface 20a.

The substrate 20 shown in FIG. 1 includes conductor patterns (first to fourth coil connection patterns 21a to 21d and the like) exposed on the first surface 20a, the GND pattern 30 not exposed on the first surface 20a, a GND via 32 or GND vias for ESD 34 and 35 to be described later, wirings of other conductors not exposed on the first surface 20a, and an insulating layer that insulates each pattern and wiring or covers the surface. The substrate 20 may be a single-sided substrate whose mounting surface is only the first surface 20a, or a double-sided substrate whose surface opposite to the first surface 20a is also a mounting surface.

The arrangement and the like of each pattern on the substrate 20 will be described in detail later.

In addition, the composite electronic component 10 shown in FIG. 1 will be described on the assumption that a direction parallel to the first direction D1 perpendicular to the first surface 20a of the substrate 20 is a Z-axis direction, a direction perpendicular to the Z-axis direction and parallel to the winding axis direction of the coil component 40 is an X-axis direction, and a direction perpendicular to the Z-axis direction and the X-axis direction is a Y-axis direction.

Figure 3:
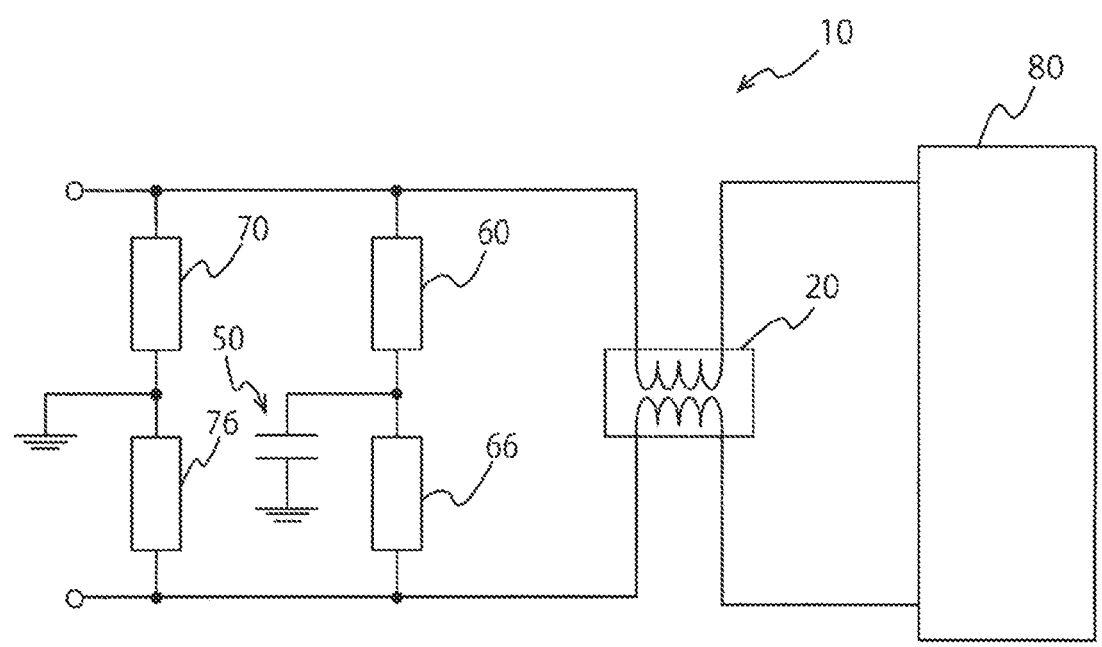
FIG. 3 is an equivalent circuit diagram of the composite electronic component shown in FIG. 1.

The coil component 40 shown in FIG. 1 has at least three (four in the embodiment) terminals, a core 43, and windings 42. As shown in FIG. 3, which is an equivalent circuit diagram of the composite electronic component 10, the coil component 40 is a common mode filter (common mode choke coil) in which two independent windings 42 are magnetically coupled by the core 43. In addition, in the composite electronic component 10, the coil component 40 as a common mode filter, the capacitor 50 as a bypass capacitor, the resistive elements 60 and 66, and the like are combined to form an EMC component or the like for reducing noise. The composite electronic component 10 is electrically connected to, for example, a transceiver 80 or the like.

However, the coil component 40 used in the composite electronic component 10 is not limited to only the common mode filter, and may be other inductor elements including a winding (coil) or may be a composite element including an inductor element and other elements. In addition, the composite electronic component 10 is not limited to only the EMC countermeasure component.

As shown in FIG. 1, the coil component 40 has four terminals of a first terminal 41a, a second terminal 41b, a third terminal 41c, and a fourth terminal 41d (see FIG. 4 for the first terminal 41a). The coil component 40 has a substantially rectangular parallelepiped outer shape, and the first to fourth terminals 41a to 41d are arranged at the four corners of the coil component 40. The first terminal 41a and the third terminal 41c are electrically connected to one winding 42 included in the coil component 40, and the second terminal 41b and the fourth terminal 41d are connected to the other winding 42 included in the coil component 40.

The coil component 40 is fixed to the first surface 20a of the substrate 20 by connecting the first to fourth terminals 41a, 41b, 41c, and 41d to first to fourth coil connection patterns 21a, 21b, 21c, and 21d formed on the first surface 20a of the substrate 20, respectively. A method for mounting the coil component 40 on the substrate 20 includes, for example, reflow soldering, but is not particularly limited.

As shown in FIG. 1, the lower end of the winding 42 of the coil component 40 is located at a position higher than the lower ends of the first to fourth terminals 41a, 41b, 41c, and 41d fixed to the first surface 20a of the substrate 20. Therefore, in the composite electronic component 10, a gap is formed between the winding 42 of the coil component 40 and the first surface 20a of the substrate 20, and the capacitor 50, the resistive elements 60 and 66, and the like are arranged in the gap.

The capacitor 50 as an overlapping arrangement component is an electronic component having a lower height (length in first direction D1 when mounted) than the coil component 40. At least a part of the capacitor 50 overlaps the coil component 40 when viewed from the first direction D1 perpendicular to the first surface 20a.

The capacitor 50 is a chip capacitor surface-mounted on the substrate 20, and has a substantially rectangular parallelepiped outer shape. FIG. 4 is a conceptual diagram showing respective electronic components on the substrate 20 of the composite electronic component 10 and the arrangement state of structures within the substrate 20. FIG. 4 is a diagram when the composite electronic component 10 is viewed from the first direction D1 (positive Z-axis direction) side, and shows the coil component 40 in a transparent manner (shows only the schematic shape with a two-dot chain line).

As shown in FIG. 4, the capacitor 50 has a first terminal 51a formed at one end and a second terminal 51b formed at the other end. The capacitor 50 is fixed to the first surface 20a of the substrate 20 by connecting the first terminal 51a and the second terminal 51b to the first and second component connection patterns 23a and 23b formed on the first surface 20a of the substrate 20, respectively. In addition, the overlapping arrangement component is not limited to only the capacitor 50, and may be an electronic component other than the capacitor 50.

As shown in FIG. 1, the composite electronic component 10 includes two resistive elements 60 and 66. As shown in FIGS. 1 and 4, the resistive elements 60 and 66 are mounted on the first surface 20a of the substrate 20 so that at least parts thereof overlap the coil component 40 when viewed from the first direction D1. The resistive elements 60 and 66 are chip components having a substantially rectangular parallelepiped outer shape, but are not limited to only the chip components.

As shown in FIG. 4, the resistive element 60 has a first terminal 61a provided at one end and a second terminal 61b provided at the other end. The resistive element 60 is fixed to the first surface 20a of the substrate 20 by connecting the first terminal 61a and the second terminal 61b to the first and second resistor connection patterns 25a and 25b (see FIG. 2) formed on the first surface 20a of the substrate 20, respectively. Similarly to the resistive element 60, the resistive element 66 having a first terminal 67a and a second terminal 67b is also fixed to the substrate 20 through the first and second resistor connection patterns 26a and 26b (see FIG. 2).

As shown in FIG. 1, the composite electronic component 10 includes the two ESD protection elements 70 and 76. As shown in FIGS. 1 and 4, the ESD protection elements 70 and 76 are mounted on the first surface 20a of the substrate 20 so that at least parts thereof overlap the coil component 40 when viewed from the first direction D1. The ESD protection elements 70 and 76 are formed by multilayer chip varistors, Zener diodes, or the like, and are chip components having a substantially rectangular parallelepiped outer shape. However, the ESD protection elements 70 and 76 are not limited to only the chip components.

As shown in FIG. 4, the ESD protection element 70 has a first terminal 71a provided at one end and a second terminal 71b provided at the other end. The ESD protection element 70 is fixed to the first surface 20a of the substrate 20 by connecting the first terminal 71a and the second terminal 71b to the first and second ESD connection patterns 28a and 28b (see FIG. 2) formed on the first surface 20a of the substrate 20, respectively. Similarly to the ESD protection element 70, the ESD protection element 76 having the first terminal 77a and the second terminal 77b is also fixed to the substrate 20 through the first and second ESD connection patterns 29a and 29b (see FIG. 2). Similarly to the coil component 40, the capacitor 50, the resistive elements 60 and 66, and the ESD protection elements 70 and 76 are also mounted on the first surface 20a of the substrate 20 by, for example, reflow soldering.

FIG. 2 is a diagram when the substrate 20 of the composite electronic component 10 shown in FIG. 1 is viewed from the first direction D1 (positive Z-axis direction) perpendicular to the first surface 20a. As shown in FIG. 2, the substrate 20 has at least three (four in the embodiment) first to fourth coil connection patterns 21a to 21d that are formed on the first surface 20a and are respectively connected to the first to fourth terminals 41a to 41d of the coil component 40.

In addition, the substrate 20 has at least two (two in the embodiment) first and second component connection patterns 23a and 23b that are formed on the first surface 20a and are respectively connected to the first and second terminals 51a and 51b of the capacitor 50, which are overlapping arrangement components. Additionally, four first resistor connection patterns 25a and 26a and second resistor connection patterns 25b and 26b respectively connected to the first terminals 61a and 67a and the second terminals 61b and 67b of the resistive elements 60 and 66 and four first ESD connection patterns 28a and 29a and second ESD connection patterns 28b and 29b respectively connected to the first terminals 71a and 77a and the second terminals 71b and 77b of the ESD protection elements 70 and 76 are formed on the first surface 20a of the substrate 20.

As shown in FIG. 2, the first to fourth coil connection patterns 21a to 21d, the first and second component connection patterns 23a and 23b, the first resistor connection patterns 25a and 26a, the second resistor connection patterns 25b and 26b, the first ESD connection patterns 28a and 29a, and the second ESD connection patterns 28b and 29b, all of which are exposed on the first surface 20a, are connected to wirings inside the substrate 20 (shown by dotted lines in FIG. 2). In addition, some of these patterns are electrically connected to each other by the wiring inside the substrate 20.

For example, as shown in FIG. 4, on the substrate 20, the first terminal 61a that is one end of the resistive element 60 is wired to the first coil connection pattern 21a, which is one of the coil connection patterns 21a to 21d. In addition, on the substrate 20, the second terminal 61b that is the other end of the resistive element 60 is wired to the first component connection pattern 23a, which is not connected to the GND via 32, of the component connection patterns 23a and 23b. Similarly to the resistive element 60, the first terminal 67a and the second terminal 67b of the resistive element 66 are connected to the second coil connection pattern 21b, which is another one of the coil connection patterns 21a to 21d, and the first component connection pattern 23a, respectively.

In addition, for example, as shown in FIG. 4, on the substrate 20, the first terminal 71a of the ESD protection element 70 is wired to the first coil connection pattern 21a, which is one of the coil connection patterns 21a to 21d. In addition, the first terminal 77a of the ESD protection element 76 is wired to the second coil connection pattern 21b, which is another one of the coil connection patterns 21a to 21d.

As shown in FIG. 2, the substrate 20 includes the GND via 32 that electrically connects the second component connection pattern 23b, which is one of the component connection patterns 23a and 23b, and the GND pattern 30 (see FIG. 4) of the substrate 20 to each other. The GND via 32 is formed by a conductor or the like that penetrates an insulating layer (not shown) of the substrate 20, and is formed in the first direction D1 (Z-axis direction) inside the substrate 20. The GND via 32 connects the second component connection pattern 23b on the first surface 20a or the wiring near the first surface 20a connected thereto and the GND pattern 30, which is formed on a back side (negative Z-axis direction side) with respect to the second component connection pattern 23b or the wiring with an insulating layer interposed therebetween, to each other in the Z-axis direction.

In addition, in addition to the GND via 32, the substrate 20 includes the GND vias for ESD 34 and 35 for electrically connecting the second ESD connection patterns 28b and 29b (see FIG. 2) and the GND pattern 30 to each other. Similarly to the GND via 32, the GND vias for ESD 34 and 35 are also formed by a conductor or the like that penetrates an insulating layer (not shown) of the substrate 20.

The composite electronic component 10 having an equivalent circuit shown in FIG. 3 is formed by mounting the coil component 40, the capacitor 50, the resistive elements 60 and 66, and the ESD protection elements 70 and 76 on the substrate 20 shown in FIG. 4.

Here, as shown in FIG. 2, the GND via 32 is a substrate outer region 38 that is outside a region of a hypothetical polygon 36 (a quadrangle in the embodiment), which connects all of the coil connection patterns 21a to 21d on the substrate 20 with the shortest perimeter, when viewed from the first direction D1 (Z-axis direction). In addition, in FIG. 2, the hypothetical polygon 36 is shown by a two-dot chain line.

As shown in FIG. 4, on the substrate 20, the GND via 32 is arranged in the substrate outer region 38. Therefore, when viewed from the first direction D1, a region where the GND pattern 30 is formed (a region indicated by diagonal hatching in FIG. 4) and a substrate inner region 37 (a region indicated by the dot pattern in FIG. 4), which is inside the region of the hypothetical polygon 36, can be made not to overlap each other. In addition, when the ESD protection elements 70 and 76 are mounted on the substrate 20, the GND vias for ESD 34 and 35 are also arranged in the substrate outer region 38 similarly to the GND via 32.

In the composite electronic component 10 having such a substrate 20, the area where the GND pattern 30 overlaps or is adjacent to other patterns (including a wiring) or the like is reduced, and the generation of stray capacitance around the GND pattern 30 is reduced. Therefore, the noise generated in the electrical signal transmitted through the circuit formed by the composite electronic component 10 can be effectively reduced. By the composite electronic component 10 in which the coil component 40 is a common mode filter, an EMC countermeasure component that effectively reduces noise can be realized.

On the other hand, as shown in FIG. 4, at least parts of the resistive elements 60 and 66 are arranged in the substrate inner region 37, which is inside the region of the hypothetical polygon 36, when viewed from the first direction D1 (Z-axis direction). In addition, at least a part (in the embodiment, the entire first component connection pattern 23a) of the first component connection pattern 23a, which is not connected to the GND via 32, of the component connection patterns 23a and 23b is also arranged in the substrate inner region 37 when viewed from the first direction D1 (Z-axis direction).

As shown in FIG. 4, by arranging at least parts of the resistive elements 60 and 66 or at least a part of the first component connection pattern 23a in the substrate inner region 37, the wiring distance within the substrate 20 can be shortened, and this contributes to miniaturization of the composite electronic component 10. In addition, in the composite electronic component 10, the GND pattern 30 does not overlap the substrate inner region 37. Therefore, since the problem of stray capacitance generated between the pattern or wiring arranged in the substrate inner region 37 and the GND pattern 30 is prevented, noise can be reduced.

Hereinafter, the composite electronic component 10 will be described in more detail with reference to Examples. However, the technology of the present disclosure is not limited to only these Examples.

Figure 5A:
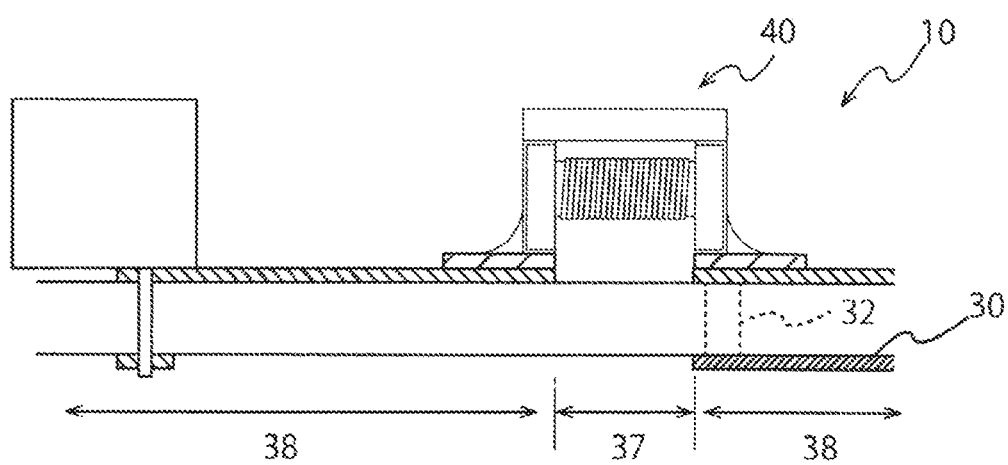
FIG. 5A is a conceptual diagram of a composite electronic component according to Example.
Figure 5B:
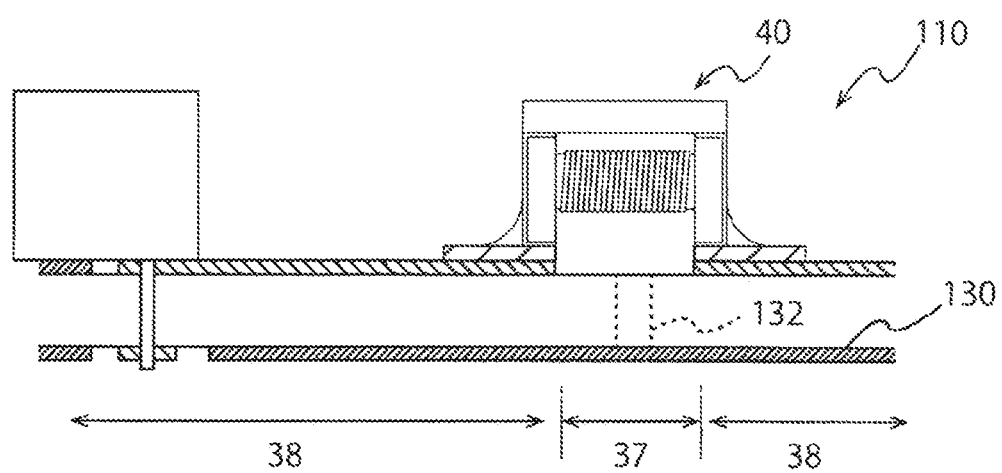
FIG. 5B is a conceptual diagram of a composite electronic component according to Comparative Example.

FIGS. 5A and 5B are conceptual diagrams showing the composite electronic component 10 (FIG. 5A) used in the measurement according to an Example and a composite electronic component 110 (FIG. 5B) used in the measurement according to Comparative Example, respectively. In the example, as shown in FIG. 5A, the GND via 32 was arranged in the substrate outer region 38 as in the composite electronic component 10 shown in FIG. 4, and noise was measured by using the composite electronic component 10 in which the substrate inner region 37 and the GND pattern 30 did not overlap each other. On the other hand, in Comparative Example, as shown in FIG. 5B, a GND via 132 was arranged in the substrate inner region 37, and noise was measured by using the composite electronic component 110 in which the substrate inner region 37 and a GND pattern 130 overlapped each other. The composite electronic component 110 according to Comparative Example is the same as the composite electronic component 10 according to Example except for the arrangement of the GND via 132 and the shape of the GND pattern 130.

Figure 6:
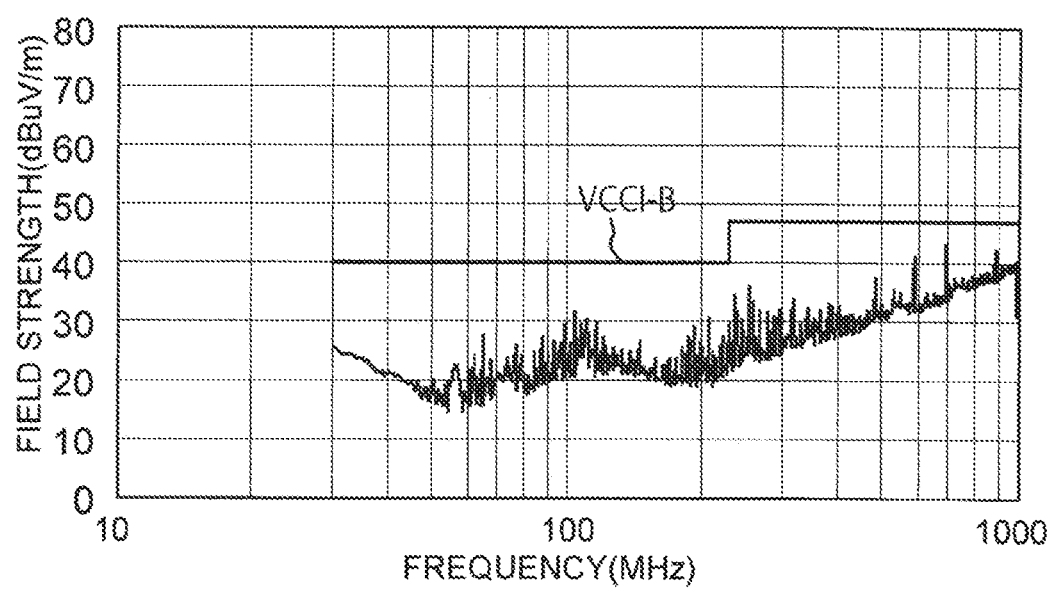
FIG. 6 is a diagram showing noise generated in the composite electronic component according to the Example.
Figure 7:
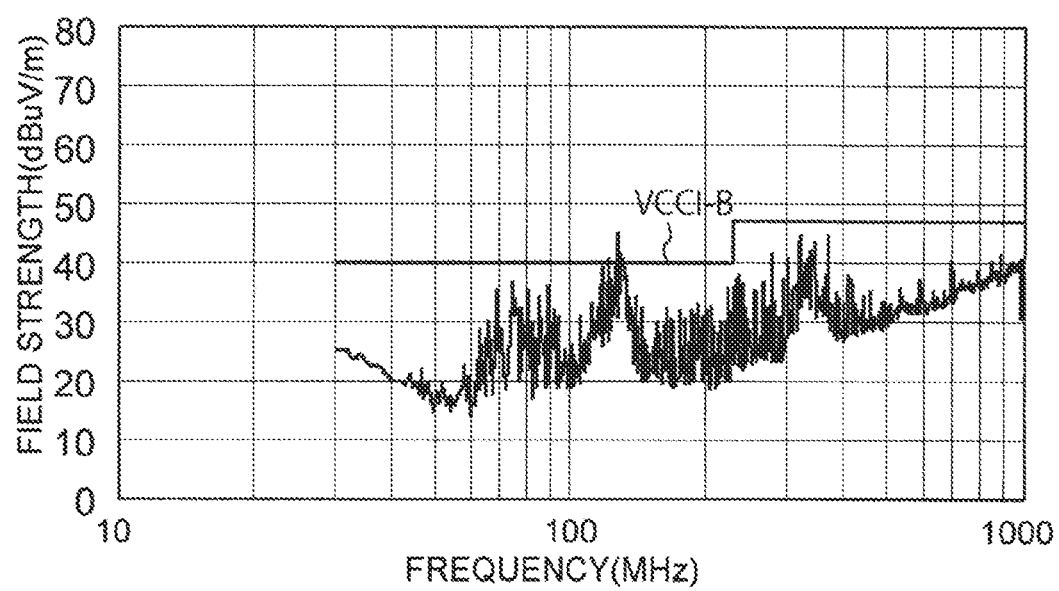
FIG. 7 is a diagram showing noise generated in the composite electronic component according to Comparative Example.

FIG. 6 shows a graph of the noise measurement result according to Example shown in FIG. 5A, and FIG. 7 shows a graph of the noise measurement result according to Comparative Example shown in FIG. 5B. In addition, FIGS. 6 and 7 show the radiation intensity of VCCI-B together with the noise measurement results.

As shown in FIG. 6, in Example shown in FIG. 5A, in any frequency band from 30 MHz to 1 GHz, the noise strength is reduced to the extent that the VCCI-B standard is satisfied. On the other hand, in Comparative Example shown in FIG. 5B, the noise strength exceeds the VCCI-B standard in the frequency band around 110 MHz. As a whole, a result that the noise strength was stronger than that in Example was obtained. The difference between the measurement result of Example shown in FIG. 6 and the measurement result of Comparative Example shown in FIG. 7 is thought to be due to the difference in how stray capacitance is generated in the composite electronic components 10 and 110.

Although the composite electronic component 10 has been described above with reference to the embodiment and Examples, it is needless to say that the scope of the present disclosure is not limited to only these embodiment and Examples and many other embodiments and examples are included. For example, as shown in FIG. 2, in the composite electronic component 10, the hypothetical polygon 36 is a quadrangle, but the shape of the hypothetical polygon changes depending on the number and arrangement of coil connection patterns. For example, the hypothetical polygon that connects all the coil connection patterns with the shortest perimeter may be a triangle, or may be a pentagon or higher polygons.

EXPLANATIONS OF LETTERS OR NUMERALS 10, 110 COMPOSITE ELECTRONIC COMPONENT
20 SUBSTRATE
20a FIRST SURFACE
21a FIRST COIL CONNECTION PATTERN
21b SECOND COIL CONNECTION PATTERN
21c THIRD COIL CONNECTION PATTERN

21d FOURTH COIL CONNECTION PATTERN
23a FIRST COMPONENT CONNECTION PATTERN
23b SECOND COMPONENT CONNECTION PATTERN
25a, 26a FIRST RESISTOR CONNECTION PATTERN
25b, 26b SECOND RESISTOR CONNECTION PATTERN
28a, 29a FIRST ESD CONNECTION PATTERN
28b, 29b SECOND ESD CONNECTION PATTERN
30, 130 GND PATTERN
32, 132 GND VIA
34, 35 GND VIA FOR ESD
36 HYPOTHETICAL POLYGON
37 SUBSTRATE INNER REGION
38 SUBSTRATE OUTER REGION
40 COIL COMPONENT
41a FIRST TERMINAL
41b SECOND TERMINAL
41c THIRD TERMINAL
41d FOURTH TERMINAL
42 WINDING
43 CORE
50 CAPACITOR
51a FIRST TERMINAL
51b SECOND TERMINAL
60, 66 RESISTIVE ELEMENT
61a, 67a FIRST TERMINAL
61b, 67b SECOND TERMINAL
70, 76 ESD PROTECTION ELEMENT
71a, 77a FIRST TERMINAL
71b, 77b SECOND TERMINAL
D1 FIRST DIRECTION
80 TRANSCEIVER

What is claimed is:

1. A composite electronic component, comprising:
a substrate having a GND pattern;
a coil component having at least three terminals and mounted on a first surface of the substrate; and
an overlapping arrangement component that is an electronic component having a height lower than that of the coil component and that is mounted on the first surface so that at least a part of the overlapping arrangement component overlaps the coil component when viewed from a first direction perpendicular to the first surface,
wherein the substrate has at least three coil connection patterns formed on the first surface and connected to the terminals, at least two component connection patterns formed on the first surface and connected to the overlapping arrangement component, and a GND via electrically connecting one of the component connection patterns and the GND pattern to each other, and
the GND via is arranged in a substrate outer region, which is outside a region of a hypothetical polygon connecting all of the coil connection patterns on the substrate with a shortest perimeter, when viewed from the first direction.

2. The composite electronic component according to claim 1,
wherein the coil component is a common mode filter.

3. The composite electronic component according to claim 1,
wherein the overlapping arrangement component is a capacitor.

4. The composite electronic component according to claim 1, further comprising:
a resistive element mounted on the first surface so that at least a part of the resistive element overlaps the coil component when viewed from the first direction,
wherein, one end of the resistive element is wired to one of the coil connection patterns on the substrate, and the other end of the resistive element is wired to another one of the component connection patterns on the substrate.

5. The composite electronic component according to claim 4,
wherein at least a part of the resistive element is arranged in a substrate inner region, which is inside the region of the hypothetical polygon on the substrate, when viewed from the first direction.

6. The composite electronic component according to claim 1,
wherein at least a part of another one of the component connection patterns is arranged in a substrate inner region, which is inside the region of the hypothetical polygon on the substrate, when viewed from the first direction.

7. The composite electronic component according to claim 1, further comprising:
an ESD protection element mounted on the first surface so that at least a part of the ESD protection element overlaps the coil component when viewed from the first direction,
wherein, on the substrate, the ESD protection element is wired to one of the coil connection patterns.

* * * * *